United States Patent
Kim

(10) Patent No.: US 8,803,557 B2
(45) Date of Patent: Aug. 12, 2014

(54) COMPARATOR CIRCUIT AND SIGNAL COMPARISON METHOD

(71) Applicant: SK hynix Inc., Gyeonggi-do (KR)

(72) Inventor: Ki-Han Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/844,931

(22) Filed: Mar. 16, 2013

(65) Prior Publication Data
US 2014/0176191 A1 Jun. 26, 2014

(30) Foreign Application Priority Data
Dec. 26, 2012 (KR) .................. 10-2012-0153051

(51) Int. Cl.
*H03K 5/22* (2006.01)

(52) U.S. Cl.
USPC ............................. 327/65; 327/307

(58) Field of Classification Search
USPC ............ 327/65, 70, 72, 77, 87, 89, 307
See application file for complete search history.

(56) References Cited

U.S. PATENT DOCUMENTS

| 5,646,575 A | * | 7/1997 | Sauer ........................ 330/261 |
| 6,653,893 B2 | * | 11/2003 | Casper et al. .................. 330/9 |
| 2009/0261882 A1 | * | 10/2009 | Arsovski et al. ............... 327/307 |

FOREIGN PATENT DOCUMENTS

| KR | 100341590 | 6/2002 |
| KR | 1020030014701 | 2/2003 |

* cited by examiner

*Primary Examiner* — Quan Tra
(74) *Attorney, Agent, or Firm* — IP & T Group LLP

(57) ABSTRACT

A comparator circuit includes a first comparator configured to store an offset during a first period, and to compare first and second input signals while compensating for the stored offset to generate a first comparison signal during a second period, a second comparator configured to compare the first and second input signals while compensating for an offset to generate a second comparison signal, and a compensation amount controller configured to control an offset compensation amount of the second comparator when the first and second comparison signals have different values.

22 Claims, 4 Drawing Sheets

COMPARATOR CIRCUIT AND SIGNAL COMPARISON METHOD

CROSS-REFERENCE TO RELATED APPLICATIONS

The present application claims priority of Korean Patent Application No. 10-2012-0153051, filed on Dec. 26, 2012, which is incorporated herein by reference in its entirety.

BACKGROUND

1. Field

Exemplary embodiments of the present invention relate to semiconductor design technology, and more particularly to a comparator circuit and a signal comparison method.

2. Description of the Related Art

In general, a comparator refers to a circuit, which compares analog signals inputted through two or more input terminals and transmits one of two values to an output terminal determined based on the comparison result. Here, the analog signal means a signal having a continuous magnitude during a given time. Furthermore, the output signal of the comparator is a digital signal having any one of the two values. The comparator may function as a kind of 1-bit analog to digital converter.

The comparator may be configured as an operational amplifier and the like. In a semiconductor circuit such as the operational amplifier, an offset voltage may occur due to an error in design or a package, a variation in semiconductor fabrication process or an external environment. Since an ideal comparator has no offset voltage, one of two values determined based on the magnitudes of inputted analog signals is outputted.

However, due to an offset voltage occurring in an operational amplifier or other circuits in the comparator, it may be difficult to accurately compare the magnitudes of the inputted analog signals.

FIG. 1 is a circuit diagram illustrating a conventional comparator circuit for compensating an offset voltage occurring in the comparator circuit.

Referring to FIG. 1, the comparator circuit includes an operational amplifier AMP, a capacitor COFF and first to third switches SW1 to SW3. The capacitor COFF is configured to store an offset voltage.

The comparator circuit of FIG. 1 performs an operation of comparing signals inputted to two input terminals I1 and I2, and the operation may be divided into first and second periods. The comparator circuit performs an offset storing operation of storing an offset voltage in the capacitor COFF during the first period, and performs a comparison operation of outputting a result obtained by comparing the signals inputted to the two input terminals I1 and I2 with reflection of the offset voltage stored in the capacitor COFF during the second period.

First, the offset store operation will be described. During the first period, the first and third switches SW1 and SW3 are turned on, and the second switch SW2 is turned off. For convenience of description, an offset voltage VOFF existing in the comparator circuit is represented by a DC voltage source OFFSET. During the first period, a voltage outputted to an output terminal OUT of the operational amplifier AMP is equal to the offset voltage VOFF. This is because the comparator circuit operates as a single gain loop. Therefore, the offset voltage VOFF outputted to the output terminal OUT of the operational amplifier is stored in the capacitor COFF by the operation of the first period.

Next, the comparison operation will be described. During the second period, the first and third switches SW1 and SW3 are turned off and the second switch SW2 is turned on. At this time, the offset voltage VOFF existing in the comparator circuit and represented by the DC voltage source OFFSET is connected to the first input terminal I2, and the capacitor COFF storing the offset voltage VOFF is connected to the second input terminal I1. Therefore, before input signals Vm and Vp are supplied to the first and second input terminals I1 and I2, the first and second input terminals I1 and I2 have the same potential. Therefore, the value outputted to the output terminal OUT of the operational amplifier during the comparison operation depends only on the result obtained by comparing the signals inputted to the first and second input terminals I1 and I2. That is, the offset voltage VOFF existing in the comparator circuit is compensated.

However, to compensate the offset voltage VOFF, the comparator circuit of FIG. 1 has to first perform the offset storing operation of storing the offset voltage VOFF in the capacitor COFF and then perform the comparison operation of comparing the input signals Vm and Vp. Therefore, the operation time for comparing the input signals may increase as a whole. Further, when a plurality of comparison operations are performed, temporal discontinuity occurs between time points at which the respective comparison results are generated.

SUMMARY

Exemplary embodiments of the present invention are directed to a comparator circuit that may remove temporal discontinuity occurring in generating a comparison result when a comparison operation is performed after compensating an offset or error occurring in the comparator circuit, to compare the magnitudes of two or more input signals, and a signal comparison method.

Other embodiments of the present invention are directed to a comparator circuit that may reduce an offset or an error occurring in the comparator circuit and a signal comparison method, while successively generating the comparison results.

In an embodiment, a comparator circuit includes a first comparator configured to store an offset during a first period, and to compare first and second input signals while compensating for the stored offset to generate a first comparison signal during a second period, a second comparator configured to compare the first and second input signals while compensating for an offset to generate a second comparison signal, and a compensation amount controller configured to control an offset compensation amount of the second comparator when the first and second comparison signals have different values.

In another embodiment, a comparator circuit includes a first comparator configured to determine the level of a first bias voltage during a first period and to generate a first comparison signal by comparing first and second input signals using the first bias voltage during a second period, a second comparator configured to generate a second comparison signal by comparing the first and second input signals using a second bias voltage, and a bias controller configured to control the level of the second bias voltage when the first and second comparison signals have different values.

In yet another embodiment, a signal comparison method includes storing a first offset, comparing a first input signal and a second input signal with compensating for the stored first offset to generate a first comparison signal, comparing the first and second input signals while compensating for a second offset to generate a second comparison signal, and controlling a compensation amount of the second offset when the first and second comparison signals have different values.

DETAILED DESCRIPTION

Figure 1:
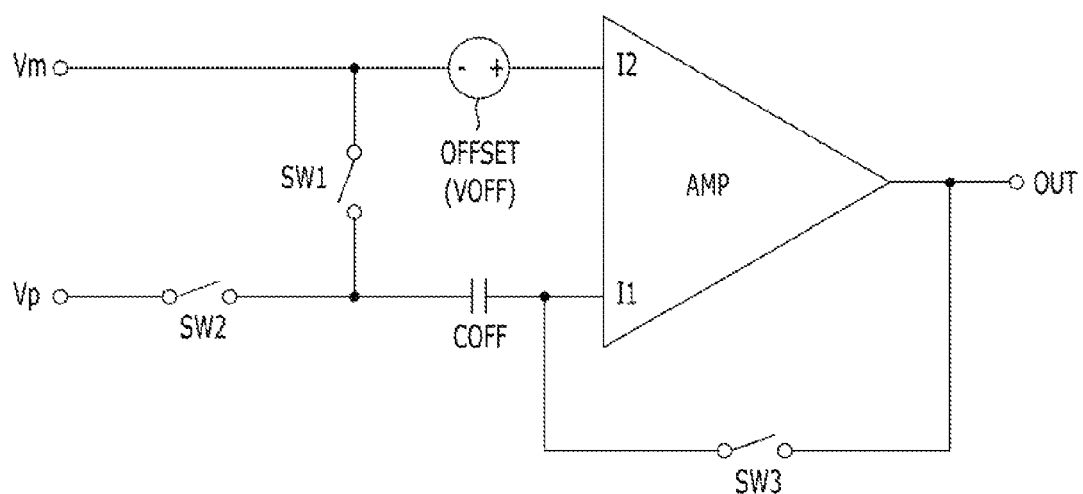
FIG. 1 is a circuit diagram illustrating a conventional comparator circuit for compensating an offset voltage occurring in the comparator circuit.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
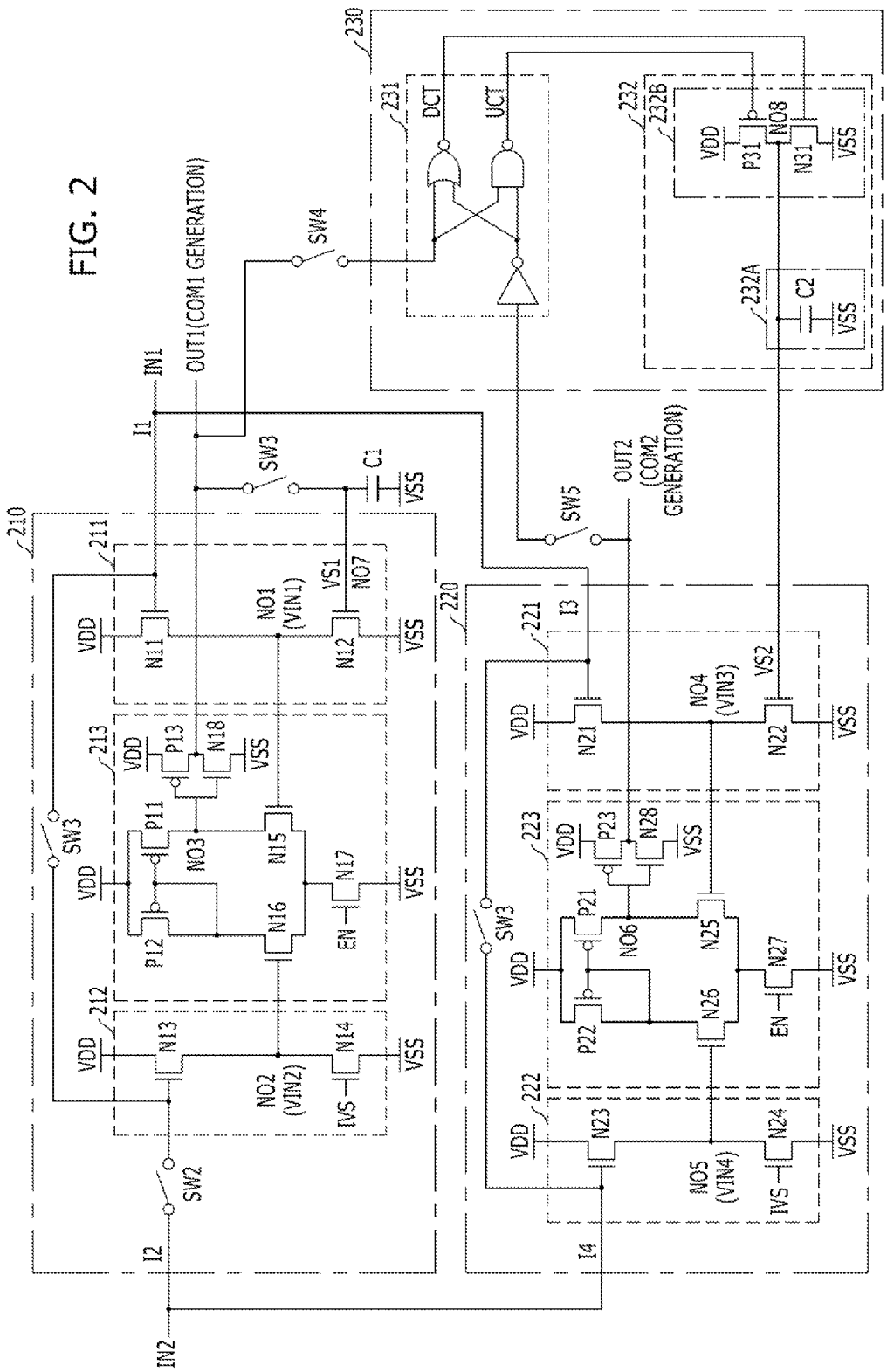
FIG. 2 is a circuit diagram illustrating a comparator circuit in accordance with an embodiment of the present invention.

FIG. 2 is a circuit diagram illustrating a comparator circuit in accordance with an embodiment of the present invention.

Referring to FIG. 2, the comparator circuit includes a first comparator 210, a second comparator 220, and a bias controller 230. The first comparator 210 is configured to determine the level of a first bias voltage VS1 during a first period and to generate a first comparison signal COM1 by comparing first and second input signals IN1 and IN2 using the first bias voltage VS1 during a second period. The second comparator 220 is configured to generate a second comparison signal COM2 by comparing the first and second input signals IN1 and IN2 using a second bias voltage VS2. The bias controller 230 is configured to control the level of the second bias voltage VS2 when the first and second comparison signals COM1 and COM2 have different values.

The first comparator 210 is configured to determine the level of the first bias voltage VS1 based on an offset voltage existing in the first comparator 210 during the first period and to generate the first comparison signal COM1 based on the result obtained by comparing the first and second input signals IN1 and IN2 using the first bias voltage VS1 during the second period.

For this operation, the first comparator 210 includes first and second terminals I1 and I2, a first voltage generation unit 211, a second voltage generation unit 212, and a first internal comparison unit 213. The first and second terminals I1 and I2 are configured to receive signals. The first voltage generation unit 211 is configured to generate a first input voltage VIN1 in response to the first bias voltage VS1 and the signal inputted to the first input terminal I1. The second voltage generation unit 212 is configured to generate a second input voltage VIN2 in response to an internal bias voltage IVS and the signal inputted to the second input terminal I2. The first internal comparison unit 213 is configured to compare the first and second input voltages VIN1 and VIN2 to generate the first comparison signal COM1.

The first and second input terminals I1 and I2 are connected to first and second switches SW1 and SW2, which are turned on/off to receive given signals during the first and second periods. Between an output terminal OUT1 and a first capacitor C1 for determining the first bias voltage VS1, a third switch SW3 is connected. The third switch SW3 is turned on/off to selectively feed back a voltage of the output terminal OUT1 to one end of the first capacitor C1. Furthermore, the output terminal OUT1 is connected to a fourth switch SW4, which is turned on/off to selectively transmit the first comparison signal COM1 to the bias controller 230 during the second period.

The first voltage generation unit 211 is configured to generate the first input voltage VIN1 in response to the first bias voltage VS1 and the signal inputted to the first input terminal I1. In detail, the first voltage generation unit 211 includes an NMOS transistor N11 and an NMOS transistor N12. The NMOS transistor N11 has a drain connected to a power supply voltage terminal VDD, a source connected to a first internal node NO1, and a gate receiving the signal inputted to the first input terminal I1. The NMOS transistor N12 has a source connected to a ground voltage terminal VSS, a drain connected to the first internal node NO1, and a gate receiving the first bias voltage VS1.

The first input voltage VIN1 is generated from the first internal node NO1, and the level of the first input voltage VIN1 is determined based on the level of the first bias voltage VS1 and the signal inputted to the first input terminal I1. The level of the first input voltage VIN1 increases as the level of the first bias voltage VS1 becomes lower and the voltage level of the signal inputted to the first input terminal I1 becomes higher. Furthermore, the level of the first input voltage VIN1 decreases as the level of the first bias voltage VS1 becomes higher and the voltage level of the signal Inputted to the first input terminal I1 becomes lower. For reference, the first bias voltage VS1 is determined based on a voltage across the first capacitor C1, that is, electric charge stored in the first capacitor C1.

The second voltage generation unit 212 is configured to generate the second input voltage VIN2 in response to the internal bias voltage IVS and the signal inputted to the second input terminal I2. In detail, the second voltage generation unit 212 includes an NMOS transistor N13 and an NMOS transistor N14. The NMOS transistor N13 has a drain connected to the power supply voltage terminal VDD, a source connected to a second internal node NO2, and a gate receiving the signal inputted to the second input terminal I2. The NMOS transistor N14 has a source connected to the ground voltage terminal VSS, a drain connected to the internal second node NO2, and a gate receiving the internal bias voltage IVS.

The level of the second input voltage VIN2 generated from the second internal node NO2 is determined based on the voltage level of the signal IN2 inputted to the second input terminal I2, since the level of the internal bias voltage IVS is fixed. The level of the second input voltage VIN2 increases as the voltage level of the signal IN2 inputted to the second input terminal I2 becomes higher. Furthermore, the level of the second input voltage VIN2 decreases as the voltage level of the signal inputted to the second terminal becomes lower.

The first internal comparison unit 213 is configured to generate the first comparison signal COM1 by comparing the first and second input voltages VIN1 and VIN2 when an enable signal EN is activated. The first internal comparison unit 213 pulls-down a third internal node NO3 when the level of the first input voltage VIN1 is higher than the level of the second input voltage VIN2, and pulls-up the third internal node NO3 when the level of the second input voltage VIN2 is higher than the level of the first input voltage VIN1. When the voltage level of the third internal node NO3 corresponds to a low level, the first output terminal OUT1 is pull-up driven by a PMOS transistor P13, and when the voltage level of the third internal node NO3 corresponds to a high level, the first output terminal OUT1 is pull-down driven by an NMOS transistor N18. A plurality of transistors P11, P12, N15, N16, and N17 operate as a current mirror typed differential amplification circuit. Since the operation of the current mirror typed differential amplification circuit is widely known to those skilled in the art to which the present invention pertains, the detailed descriptions thereof are omitted herein.

The second comparator 220 is configured to generate the second comparison signal COM2 based on a result obtained by comparing the first and second input signals IN1 and IN2 using a second bias voltage VS2 during the first and second periods.

For this operation, the second comparator 220 includes third and fourth input terminals I3 and I4, a third voltage generation unit 221, a fourth voltage generation unit 222, and a second internal comparison unit 223. The third and fourth input terminals I3 and I4 are configured to receive signals. The third voltage generation unit 221 is configured to generate a third input voltage VIN3 in response to the second bias voltage VS2 and the signal inputted to the third input terminal I3. The fourth voltage generation unit 222 is configured to generate a fourth input voltage VIN4 in response to the Internal bias voltage IVS and the signal inputted to the fourth input terminal I4. The second internal comparison unit 223 is configured to compare the third and fourth input voltages VIN3 and VIN4 and to generate the second comparison signal COM2 through an output terminal OUT2. The output terminal OUT2 is connected to a fifth switch SW5, which is turned on/off to selectively transmit the second comparison signal COM2 to the bias controller 230 during the second period.

The third voltage generation unit 221 is configured to generate the third input voltage IV3 in response to the second bias voltage VS2 and the signal inputted to the third input terminal I3. In detail, the third voltage generation unit 221 includes an NMOS transistor N21 and an NMOS transistor N22. The NMOS transistor N21 has a drain connected to the power supply voltage terminal VDD, a source connected to a fourth internal node NO4, and a gate receiving the signal inputted to the third input terminal I3. The NMOS transistor N22 has a source connected to the ground voltage terminal VSS, a drain connected to the fourth internal node NO4, and a gate receiving the second bias voltage VS2.

The third input voltage VIN3 is generated from the fourth internal node NO4, and the level of the third input voltage VIN3 is determined based on the level of the second bias voltage VS2 and the signal inputted to the third input terminal I3. The level of the third input voltage VIN3 increases as the level of the second bias voltage VS2 becomes lower and the voltage level of the signal inputted to the third input terminal I3 becomes higher. Furthermore, the level of the third input voltage VIN3 decreases as the level of the second bias voltage VS2 becomes higher and the voltage level of the signal inputted to the third input terminal I3 becomes lower. For reference, the level of the second bias voltage VS2 is determined by the bias controller 230.

The fourth voltage generation unit 222 is configured to generate the fourth input voltage VIN4 in response to the internal bias voltage IVS and the signal inputted to the fourth input terminal I4. In detail, the fourth voltage generation unit 222 includes an NMOS transistor N23 and an NMOS transistor N24. The NMOS transistor N23 has a drain connected to the power supply voltage terminal VDD, a source connected to a fifth internal node NO5, and a gate receiving the signal inputted to the fourth input terminal I4. The NMOS transistor N24 has a source connected to the ground voltage terminal VSS, a drain connected to the fifth internal node NO5, and a gate receiving the internal bias voltage IVS.

The level of the fourth input voltage VIN4, which is generated from the fifth internal node NO5, is determined based on the voltage level of the signal inputted to the fourth input terminal I4, since the level of the internal bias voltage IVS is fixed. The level of the fourth input voltage VIN4 increases as the voltage level of the signal inputted to the fourth input terminal I4 becomes higher. Furthermore, the level of the fourth input voltage VIN4 decreases as the voltage level of the signal inputted to the fourth input terminal I4 becomes lower.

The second internal comparison unit 223 is configured to generate the second comparison signal COM2 by comparing the third and fourth input voltages VIN3 and VIN4 when the enable signal EN is activated. The second internal comparison unit 223 pulls-down a sixth internal node NO6 when the level of the third input voltage VIN3 is higher than the level of the third input voltage VIN4, and pulls-up the sixth internal node NO6 when the level of the fourth input voltage VIN4 is higher than the third input voltage VIN3. When the voltage level of the sixth internal node NO6 corresponds to a low level, the second output terminal OUT2 is pull-up driven by a PMOS transistor P23, and when the voltage level of the sixth internal node NO6 corresponds to a high level, the second output terminal OUT2 is pull-down driven by an NMOS transistor N28. A plurality of transistors P21, P22, N25, N26, and N27 operate as a current mirror typed differential amplification circuit.

The bias controller 230 controls the level of the second bias voltage VS2 in response to the first and second comparison signals COM1 and COM2 during the second period. When the first and second comparison signals COM1 and COM2 have different values during the second period, the bias controller 230 controls the second bias voltage VS2 until the values of the first and second comparison signals COM1 and COM2 are equalized to each other. When the first and second comparison signals COM1 and COM2 have the same value, the bias controller 230 maintains the level of the second bias voltage VS2 at a constant value.

More specifically, the bias controller 230 decreases the level of the second bias voltage VS2 when the first comparison signal COM1 has a high level and the second comparison signal COM2 has a low level, increases the level of the second bias voltage VS2 when the first comparison signal COM1 has a low level and the second comparison signal COM2 has a high level, and maintains the level of the second bias voltage VS2 at a constant value when both of the first and second comparison signals COM1 and COM2 have a high level or a low level.

For this operation, the bias controller 230 includes a detection signal generation unit 231 and a control unit 232. The detection signal generation unit 231 is configured to detect the logic state of first and second comparison signals COM1 and COM2 and to generate one or more detection signals UCTB and DCT, which are activated when the first and second comparison signals COM1 and COM2 have different values and deactivated when the first and second comparison signals COM1 and COM2 have the same value. The control unit 232 is configured to control the second bias voltage VS2 when the detection signals UCTB and DCT are activated, and to maintain the second bias voltage VS2 at a predetermined value when the detection signals UCTB and DCT are deactivated.

The detection signal generation unit 231 activates the first detection signal DCT when the first comparison signal COM1 is high and the second comparison signal COM2 is low, and activates the second detection signal UCTB when the first comparison signal COM1 is low and the second comparison signal COM2 is high. Here, the activation level of the first detection signal DCT corresponds to a high level, and the activation level of the second detection signal UCTB corresponds to a low level. Furthermore, the detection signal generation unit 231 activates the first and second detection signals DCT and UCTB when the both of the first and second comparison signals COM1 and COM2 are high or low.

In detail, the detection signal generation unit 231 may include an inverter, a NOR gate, and a NAND gate.

The control unit 232 decreases the second bias voltage VS2 when the first detection signal DCT is activated, and increases the second bias voltage VS2 when the second detection signal UCTB is activated. Furthermore, the control unit 232 maintains the value of the second bias voltage VS2 when both of the first and second detection signals DCT and UCTB are deactivated. In detail, the control unit 232 includes a voltage generation unit 232A and a driving unit 232B. The voltage generation unit 232A is configured to generate the second bias voltage VS2 to an internal node NO8. The driving unit 232B is configured to pull-down an internal node NO8 in response the first detection signal DCT and pull-up the internal node NO8 in response to the second detection signal UCTB. The voltage generation unit 232A includes a second capacitor C2 connected to the internal node NO8 and the ground voltage terminal VSS. Furthermore, the driving unit 232B includes an NMOS transistor N31 and a PMOS transistor P31. The NMOS transistor N31 has a drain connected to the internal node NO8, a source connected to the ground voltage terminal VSS, and a gate receiving the first detection signal DCT. The PMOS transistor P31 has a drain connected to the internal node NO8, a source connected to the power supply voltage terminal VDD, and a gate receiving the second detection signal DCT.

Hereafter, the operation of the comparator circuit will be described. For convenience of description, the operation of the comparator circuit is divided into the first period and the second period.

First, during the first period, the second and third switches SW2 and SW3 are turned on, and the first, fourth, and fifth switches SW1, SW4, and SW5 are turned off. During the first period, the same signal is inputted to the first and second input terminals 11 and 12 of the first comparator 210, and the first bias voltage VS1 is controlled based on a value outputted to the output terminal OUT1 of the first comparator. The second comparator 220 compares the first and second input signals IN1 and IN2 using the second bias voltage VS2 and generates the second comparison signal COM2.

Since both of the fourth and fifth switches SW4 and SW5 are turned off to disable the bias controller 230, both of the first and second detection signals DCT and UCTB are deactivated, and the level of the second bias voltage VS2 is maintained at a constant value.

Next, during the second period, the second and third switches SW2 and SW3 are turned off, and the first, fourth, and fifth switches SW1, SW4, and SW5 are turned on. The first comparator 210 compares the first and second input signals IN1 and IN2 using the first bias voltage VS1 determined during the first period and generates the first comparison signal COM1. At this time, the first comparison signal COM1 corresponds to a result obtained by compensating an offset existing in the first comparator 210 and comparing the first and second input signals IN1 and IN2. The second comparator 220 compares the first and second input signals IN1 and IN2 using the second bias voltage VS2 and generates the second comparison signal COM2. Furthermore, the second comparison signal COM2 corresponds to a result obtained by comparing the first and second input signals IN1 and IN2 without compensating an offset existing in the second comparator 220.

When the first and second comparison signals COM1 and COM2 have different values, the bias controller 230 controls the level of the second bias voltage VS2 until the values of the first and second comparison signals COM1 and COM2 are equalized. When the second bias voltage VS2 is controlled to equalize the values of the first and second comparison signals COM1 and COM2, the comparison signal COM2 corresponds to the result obtained by comparing the first and second input signals IN1 and IN2 without compensating an offset existing in the second comparator 220.

The comparator circuit in accordance with the embodiment of the present invention includes the first comparator 210 configured to store an offset to determine a bias voltage during the first period and to perform a offset-compensated comparison operation during the second period, and the second comparator 220 configured to successively perform the comparison operations during the first and second periods. At this time, the comparison results of the first and second comparator 210 and 220 during the second period are used to compensate for the offset of the second comparison unit 220. Therefore, the second comparison unit 220 may output the results obtained by successively comparing the input signals during the first and second periods, while outputting the comparison result in which the offset is compensated for. That is, the offset of the comparator circuit may be compensated by continuously comparing the input signals.

Figure 3:
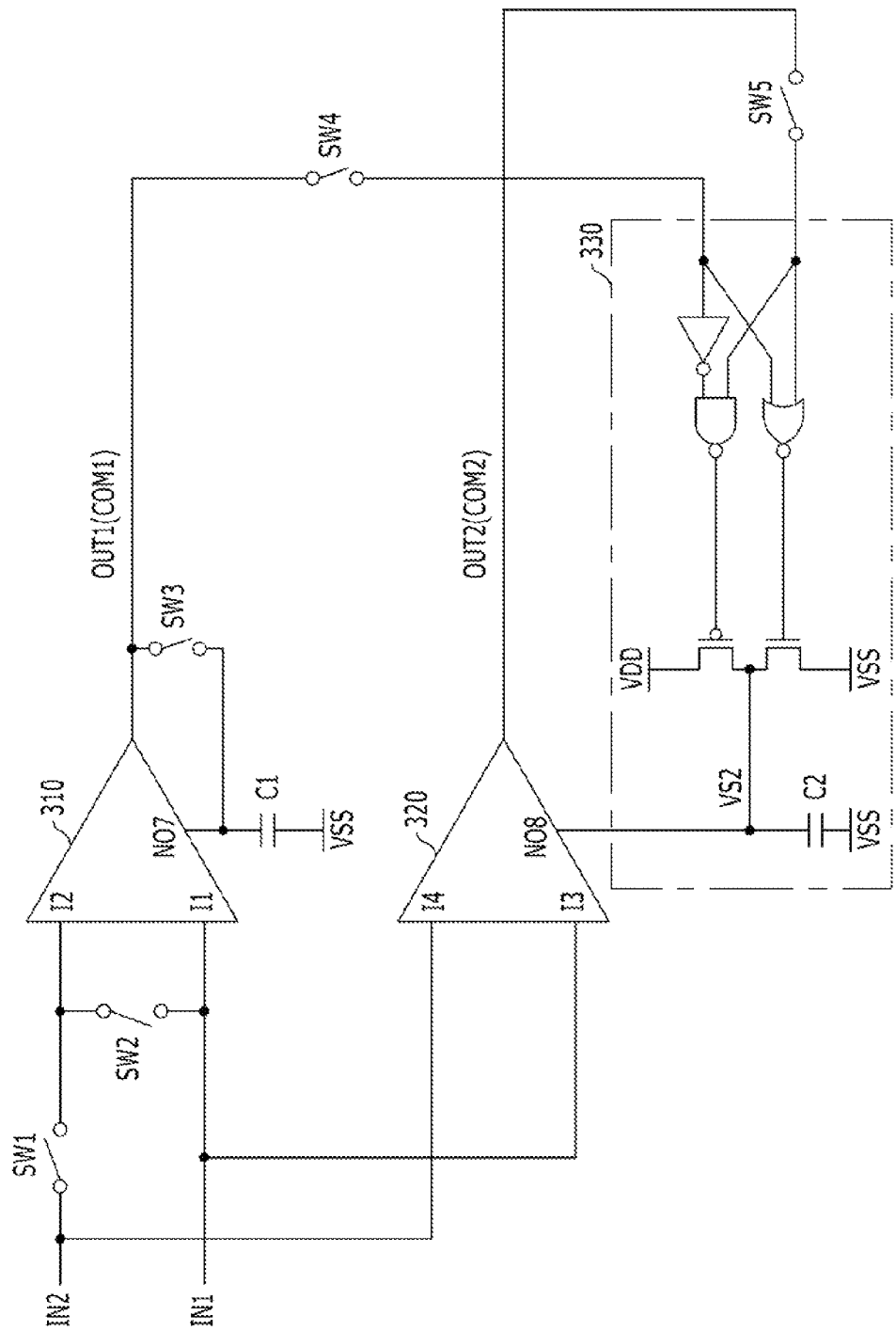
FIG. 3 is a circuit diagram illustrating a comparator circuit in accordance with another embodiment of the present invention.

FIG. 3 is a circuit diagram illustrating a comparator circuit in accordance with another embodiment of the present invention.

Referring to FIG. 3, the comparator circuit includes a first comparator 310, a second comparator 320, and a compensation amount controller 330. The first comparator 310 is configured to store an offset during a first period, to compensate for the stored offset, and to compare first and second input signals IN1 and IN2 to generate a first comparison signal COM1 during a second period. The second comparator 320 is configured to compensate for the offset and compare the first and second input signals IN1 and IN2 to generate a second comparison signal COM2. The compensation amount controller 330 is configured to control an offset compensation amount of the second comparator 320 when the first and second comparison signals COM1 and COM2 have different values.

The first comparator 310, the second comparator 320, and the compensation amount controller 330 in the comparator circuit of FIG. 3 may have the same internal configurations as the first comparator 210, the second comparator 220, and the bias controller 230 in the comparator circuit of FIG. 2, respectively. Furthermore, the connection states and operations of the first capacitor C1 and the first to fifth switches SW1 to SW5 are the same as described with reference to FIG. 2.

Since the configurations and operations of the first comparator 310, the second comparator 320, and the compensation amount controller 330 may have the same configurations and operations as the first comparator 210, the second comparator 220, and the bias controller 230 in the comparator circuit described with reference to FIG. 2, the detailed descriptions thereof are omitted herein. The operation of the comparator circuit is divided into the first period and the second period, for convenience of description.

First, during the first period, the second and third switches SW2 and SW3 are turned on, and the first, fourth, and fifth switches SW1, SW4, and SW5 are turned off. During the first period, the same signal is inputted to the first and second input terminals I1 and I2 of the first comparator 310. An offset existing in the first comparator 310 is stored in the first capacitor C1 during the first period (i.e., the first bias voltage VS1 is determined). The second comparator 320 compares the first and second input signals IN1 and IN2 using the second bias voltage VS2 and generates the second comparison signal COM2. The compensation amount controller 330 is disabled to maintain the offset compensation amount of the second comparator 320 at a constant value (i.e., the level of the second bias voltage VS2 is maintained at a constant value).

Nest, during the second period, the second and third switches SW2 and SW3 are turned off, and the first, fourth, and fifth switches SW1, SW4, and SW5 are turned on. The first comparator 310 compensates for the offset existing in the first comparator 310 using the offset stored during the first period, and compares the first and second input signals IN1 and IN2 to generate the first comparison signal COM1. The second comparator 320 compensates for the offset by an amount determined by the compensation amount controller 330 and compares the first and second input signals IN1 and IN2 to generate the second comparison signal COM2.

When the first and second comparison signals COM1 and COM2 have different values, the compensation amount controller 330 controls the offset compensation amount of the second comparator 320 until the values of the first and second comparison signals COM1 and COM2 are equalized. When the first and second comparison signals COM1 and COM2 have the same value, the offset compensation amount of the second comparator 320 is maintained at a constant value.

The comparator circuit in accordance with the embodiment of the present invention includes the first comparator 310, which stores the offset during the first period and compensates for the stored offset to perform the comparison operation during the second period, and the second comparator 320, which successively performs the comparison operations during the first and second periods. Here, the comparison result of the first comparator 310 and the comparison result of the second comparator 320 are used to compensate for the offset of the second comparator 320 during the second period. Therefore, the second comparator 320 may output the result obtained by successively comparing the input signals during the first and second periods, while outputting the comparison result in which the offset is compensated for. The comparator circuit of FIG. 3 may have the same effect as the comparator circuit of FIG. 2.

Figure 4:
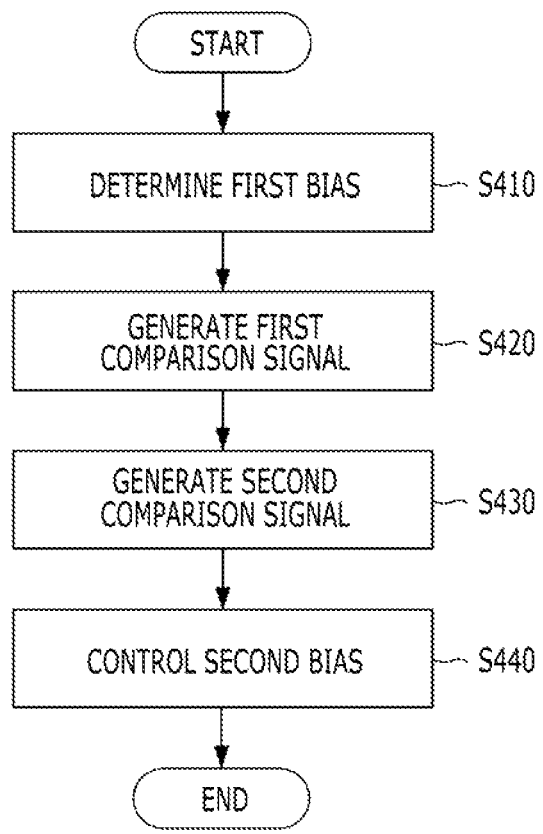
FIG. 4 is a flow chart for explaining a signal comparison method in accordance with the embodiments of the present invention.

FIG. 4 is a flow chart for explaining a signal comparison method in accordance with the embodiments of the present invention.

Referring to FIG. 4, the signal comparison method includes a first bias determination step S410 of determining a first bias voltage VS1, a first comparison signal generation step S420 of generating a first comparison signal COM1 by comparing first and second input signals IN1 and IN2 using the determined first bias voltage VS1, a second comparison signal generation step S430 of generating a second comparison signal COM2 by comparing the first and second input signals IN1 and 1N2 using a second bias voltage VS2, and a second bias control step S440 of controlling the level of the second bias voltage VS2 when the first and second input signals IN1 and IN2 have different values.

The steps S410 to S440 are not necessarily performed according to the above-described sequence, but two or more steps may be performed at the same time or overlap each other.

Referring to FIGS. 2 and 4, the signal comparison method will be described.

At the first bias decision step S410, the same signal is inputted to the first and second input terminals I1 and I2 of the first comparator 210, and the output terminal OUT1 of the first comparator 210 and the first capacitor C1 are connected to determine the first bias voltage VS1 through a process of charging or discharging the first capacitor C1 depending on a comparison result of the first comparator 210. The first bias determination step S410 is performed during the first period.

At the first comparison signal generation step S420, the first comparator 210 compares the first and second input signals IN1 and IN2 using the first bias voltage VS1 determined at the first bias voltage determination step S410 and generates the first comparison signal COM1. The first comparison signal generation step S420 is performed during the second period.

At the second comparison signal generation step S430, the second comparator 220 compares the first and second input signals IN1 and IN2 using the second bias voltage VS2 and generates the second comparison signal COM2. The second comparison generation step S430 is performed during the first and second periods.

At the second bias control step S440, the bias controller 230 controls the level of the second bias voltage VS2 based on the values of the first and second comparison signals COM1 and COM2. At this time, the level of the second bias voltage VS2 is controlled until the values of the first and second comparison signals COM1 and COM2 are equalized. The second bias control step S440 is performed during the second period.

The signal comparison method in accordance with the embodiment of the present invention may have the same effect as the comparator circuit in accordance with the embodiment of the present invention.

Referring to FIGS. 3 and 4, a signal comparison method in accordance with another embodiment of the present invention will be described.

The signal comparison method includes a step S410 of storing a first offset, a step S420 of compensating for the stored first offset and comparing first and second input signals IN1 and IN2 to generate a first comparison signal COM1, a step S430 of compensating for a second offset and comparing the first and second input signals IN1 and IN2 to generate a second comparison signal COM2, and a step S440 of controlling a compensation amount of the second offset when the first and second input signals IN1 and IN2 have different values.

The steps S410 to S440 are not necessarily performed according to the above-described sequence, but two or more steps may be performed at the same time or overlap with each other.

At the step S410, the same signal is inputted to the first and second input terminals I1 and I2 of the first comparator 310, and the output terminal OUT1 of the first comparator and the first capacitor C1 are connected to store a first offset through a process of charging or discharging the first capacitor C1 depending on the comparison result of the first comparator 310. The step S410 is performed during the first period.

At the step S420, the first comparator 310 compensates for the first offset determined at the step S410 and compares the first and second input signals IN1 and IN2 to generate the first comparison signal COM1. The step S420 is performed during the second period.

At the step S430, the second comparator 320 compensates for an offset based on an initial offset compensation amount and compares the first and second input signals IN1 and IN2 to generate the second comparison signal COM2. The step S430 is performed during the first and second periods. Here, when the offset is compensated based on the initial offset compensation amount, it means that the initial second bias voltage VS2 is used to perform the comparison operation.

At the step S440, the bias controller 330 controls the compensation amount of the second offset based on the values of the first and second comparison signals COM1 and COM2. The compensation amount of the second offset refers to how much the second comparator 320 is to compensate for the offset existing in the second comparator 320. The compensation amount of the second offset is controlled until the values of the first and second comparison signals COM1 and COM2 are equalized. The step S440 is performed during the second period.

The signal comparison method in accordance with the embodiment of the present invention may have the same effect as the comparator circuit in accordance with the embodiment of the present invention.

In accordance with the embodiments of the present invention, a sub comparator (i.e., the first comparator) performs the offset (or error) compensation operation and the comparison operation for each period, and a main comparator (i.e., the second comparator) performs the comparison operation while compensating for the offset or the error) based on the comparison result of the sub comparator. Accordingly, the main comparator may successively generate the comparison results.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention.

What is claimed is:

1. A comparator circuit comprising:
a first comparator configured to store an offset during a first period and to compare first and second input signals while compensating for the stored offset to generate a first comparison signal during a second period;
a second comparator configured to compare the first and second input signals while compensating for an offset to generate a second comparison signal; and
a compensation amount controller configured to control an offset compensation amount of the second comparator when the first and second comparison signals have different values.

2. The comparator circuit of claim 1, wherein the compensation amount controller controls the offset compensation amount of the second comparator until the values of the first and second comparison signals are equalized during the second period.

3. The comparator circuit of claim 1, wherein the compensation amount controller maintains the offset compensation amount of the second comparator at a constant value, when the first and second comparison signals have substantially the same value during the second period.

4. The comparator circuit of claim 1, wherein the comparison amount controller comprises:

a detection signal generation unit configured to detect a state of the first and second comparison signals to generate one or more detection signals, which are activated when the first and second comparison signals have different values and deactivated when the first and second comparison signals have substantially the same value; and
a control unit configured to control the offset compensation amount of the second comparator when the one or more detection signals are activated and maintain the offset compensation amount of the second comparator at a constant value when the one or more detection signals are deactivated.

5. The comparator circuit of claim 1, wherein the first comparator comprises first and second terminals and stores the offset using the first comparison signal generated by receiving substantially the same signals through the first and second terminals.

6. A comparator circuit comprising:
a first comparator configured to determine the level of a first bias voltage during a first period and to generate a first comparison signal by comparing first and second input signals using the first bias voltage during a second period;
a second comparator configured to generate a second comparison signal by comparing the first and second input signals using a second bias voltage; and
a bias controller configured to control the level of the second bias voltage when the first and second comparison signals have different values.

7. The comparator circuit of claim 6, wherein the bias controller controls the second bias voltage until the values of the first and second comparison signals are equalized during the second period.

8. The comparator circuit of claim 6, wherein the bias controller maintains the level of the second bias voltage at a constant value when the first and second comparison signals have substantially the same value during the second period.

9. The comparator circuit of claim 6, wherein the bias controller comprises:
a detection signal generation unit configured to detect a state of first and second comparison signals to generate one or more detection signals, which are activated when the first and second comparison signals have different values and deactivated when the first and second comparison signals have substantially the same value; and
a control unit configured to control the second bias voltage when the one or more detection signals are activated and to maintain the second bias voltage at a constant value when the one or more detection signals are deactivated.

10. The comparator circuit of claim 6, wherein the first comparator generates the first comparison signal having a first value when the voltage level of the first input signal is higher than the voltage level of the second input signal, and generates the first comparison signal having a second value obtained by inverting the first value when the voltage level of the second input signal is higher than the voltage level of the first input signal, and
the second comparator generates the second comparison signal having the first value when the voltage level of the first input signal is higher than the voltage level of the second input signal, and generates the second comparison signal having the second value when the voltage level of the second input signal is higher than the voltage level of the first input signal.

11. The comparator circuit of claim 10, wherein the bias controller decreases the level of the second bias voltage when the first comparison signal has the first value and the second comparison signal has the second value, increases the level of the second bias voltage when the first comparison signal has the second value and the second comparison signal has the first value, and does not control the second bias voltage when both of the first and second comparison signals have the first value and when both of the first and second comparison signals have the second value.

12. The comparator circuit of claim 9, wherein the first comparator comprises:
   a first input terminal and a second input terminal;
   a first voltage generation unit configured to generate a first input voltage in response to the first bias voltage and a signal inputted to the first input terminal;
   a second voltage generation unit configured to generate a second input voltage in response to an internal bias voltage and a signal inputted to the second input terminal; and
   a first internal comparison unit configured to compare the first and second input voltages to generate the first comparison signal,
   wherein, during the first period, the same signal is inputted to the first and second input terminals, and
   during the second period, the first input signal is inputted to the first input terminal and the second input signal is inputted to the second input terminal.

13. The comparator circuit of claim 9, wherein the second comparator comprises:
   a third input terminal and a fourth input terminal;
   a third voltage generation unit configured to generate a third input voltage in response to the second bias voltage and a signal inputted to the third input terminal;
   a fourth voltage generation unit configured to generate a fourth input voltage in response to the internal bias voltage and a signal inputted to the fourth input terminal; and
   a second internal comparison unit configured to compare the third and fourth input voltages to generate the second comparison signal,
   wherein, the first input signal is inputted to the first input terminal and the second input signal is inputted to the second input terminal.

14. The comparator circuit of claim 9, wherein the detection signal generation unit comprises:
   a first detection signal generation unit configured to generate a first detection signal activated when the first comparison signal has the first value and the second comparison signal has the second value; and
   a second detection signal generation unit configured to generate a second detection signal activated when the first comparison signal has the second value and the second comparison signal has the first value.

15. The comparator circuit of claim 14, wherein the control unit comprises:
   a voltage generation unit configured to generate the second bias voltage to an internal node; and
   a driving unit configured to pull-down the internal node in response to the first detection signal and pull-up the internal node in response to the second detection signal.

16. The comparator circuit of claim 15, wherein the voltage generation unit comprises a capacitor connected to the internal node and a ground voltage terminal.

17. The comparator circuit of claim 16, wherein the driving unit comprises:
   an NMOS transistor having a drain connected to the internal node, a source connected to the ground voltage terminal, and a gate receiving the first detection signal; and
   a PMOS transistor having a drain connected to the internal node, a source connected to a power supply voltage terminal, and a gate receiving the second detection signal.

18. The comparator circuit of claim 13, wherein the level of the first bias voltage determined using the first comparison signal generated by receiving substantially the same signals through the first and second input terminals during the first period.

19. The comparator circuit of claim 18, further comprising a capacitor coupled to the first comparator, wherein the capacitor is configured to store the first comparison signal, which is generated by receiving substantially the same signals through the first and second input terminals, during the first period, and the voltage stored in the capacitor is used as the first bias voltage.

20. A signal comparison method comprising:
   storing a first offset;
   comparing a first input signal and a second input signal with compensating for the stored first offset to generate a first comparison signal;
   comparing the first and second input signals while compensating for a second offset to generate a second comparison signal; and
   controlling a compensation amount of the second offset when the first and second comparison signals have different values.

21. The signal comparison method of claim 20, wherein the compensation amount of the second offset is controlled until the values of the first and second comparison signals are equalized.

22. The signal comparison method of claim 21, wherein the storing of the first offset is performed during a first period, and the comparing first and second input signals is performed during a second period.

* * * * *